United States Patent
Li et al.

(10) Patent No.: US 9,022,734 B2
(45) Date of Patent: May 5, 2015

(54) CASE STRUCTURE AND FAN FRAME FIXING MODULE

(75) Inventors: Ran Li, Samutprakarn (TH); Ployjermsrikul Kitti, Samutprakarn (TH)

(73) Assignee: Delta Electronics (Thailand) Public Co., Ltd., Samutprakarn (TH)

( * ) Notice: Subject to any disclaimer, the term of this patent is extended or adjusted under 35 U.S.C. 154(b) by 492 days.

(21) Appl. No.: 13/086,120

(22) Filed: Apr. 13, 2011

(65) Prior Publication Data

US 2012/0114477 A1 May 10, 2012

(30) Foreign Application Priority Data

Nov. 9, 2010 (TW) ................................ 99138588 A

(51) Int. Cl.
F04D 29/66 (2006.01)
H05K 7/20 (2006.01)
G06F 1/20 (2006.01)
F04D 25/06 (2006.01)
F04D 29/60 (2006.01)

(52) U.S. Cl.
CPC .............. H05K 7/20172 (2013.01); G06F 1/20 (2013.01); F04D 29/668 (2013.01); F04D 25/0613 (2013.01); F04D 29/601 (2013.01)

(58) Field of Classification Search
USPC ............... 361/690, 695; 415/213, 214.1, 220; 416/500
See application file for complete search history.

(56) References Cited

U.S. PATENT DOCUMENTS

| 7,379,300 | B1 * | 5/2008 | Chen | 361/695 |
| 7,385,814 | B1 * | 6/2008 | Chen | 361/695 |
| 7,545,641 | B2 * | 6/2009 | Chen | 361/695 |
| 2006/0120041 | A1 * | 6/2006 | Chen | 361/695 |
| 2008/0014093 | A1 * | 1/2008 | Fan et al. | 416/244 R |
| 2008/0151495 | A1 * | 6/2008 | Yin et al. | 361/695 |
| 2008/0232062 | A1 * | 9/2008 | Lee | 361/687 |
| 2010/0027231 | A1 * | 2/2010 | Chang et al. | 361/807 |

FOREIGN PATENT DOCUMENTS

| CN | 2503571 | 7/2002 |
| CN | 2826511 | 10/2006 |
| CN | 200978834 | 11/2007 |
| CN | 200985912 | 12/2007 |
| CN | 101240807 | 8/2008 |
| CN | 101398708 | 4/2009 |
| TW | M300836 | 11/2006 |
| TW | M311071 | 5/2007 |

* cited by examiner

*Primary Examiner* — Dwayne J White
*Assistant Examiner* — Justin Seabe
(74) *Attorney, Agent, or Firm* — Kirton McConkie; Evan R. Witt

(57) ABSTRACT

A case structure includes a first housing and a fan frame fixing module. The fan frame fixing module includes a fan frame, a positioning part and an auxiliary part. The positioning part is disposed on the first housing. The auxiliary part is disposed on the first housing. The fan frame urges against the first housing and the positioning part, and the auxiliary part urges against the fan frame so that the fan frame is fixed on the first housing.

12 Claims, 5 Drawing Sheets

CASE STRUCTURE AND FAN FRAME FIXING MODULE

FIELD OF THE INVENTION

The present invention relates to a case structure and a fan frame fixing module, and more particularly to a case structure and a fan frame fixing module that are easily assembled and have reduced vibration.

BACKGROUND OF THE INVENTION

With increasing development of science and technology, the amount of data to be processed by data processing devices (e.g. computer systems or servers) are gradually increased. After a data processing device (e.g. a computer systems or a server) is used for a long term, a great amount of heat energy generated by the electronic components may be accumulated within the data processing device. If the heat energy fails to be effectively dissipated away, the elevated operating temperature may result in damage, reduced use life or deteriorated performance of the electronic components. For effectively transferring the heat energy to the ambient air, a fan is installed within the data processing device. In particular, for enhancing the heat-dissipating efficiency, the data processing device to process abundant number of data for a long time period should contain plural fans.

FIG. 1 is a schematic exploded view illustrating a case structure with a fan frame according to the prior art. As shown in FIG. 1, the electronic device 1 includes a case structure 10 and an outer housing 14. The case structure 10 has a receptacle 11 for accommodating a data storage device 101 (e.g. a hard disk drive or an optical disk drive), a circuit board 103 and a positioning plate 13. Plural electronic components 102 are mounted on the circuit board 103. The positioning plate 13 is accommodated within the receptacle 11, and connected with the outer housing 14. In addition, plural fans 12 are disposed on the positioning plate 13. The positioning plate 13 has plural holes 131 corresponding to the perforations 121 at the four corners of respective fans 12. By penetrating plural screws 122 through corresponding perforations 121 and holes 131, the fans 12 are fixed on the positioning plate 13. After the case structure 10 is combined with the outer housing 14, the receptacle 11 becomes a close space. Meanwhile, the heat energy generated from the data storage device 101 of the electronic components 102 within the receptacle 11 may be dissipated away by the plural fans 12.

Since the fans 12 are fixed on the positioning plate 13 by tightening plural screws 122 on the four corners of respective fans 12 and then the positioning plate 13 is accommodated within the receptacle 11, the process of assembling the fans 12 or the case structure 10 is very complicated. Under this circumstance, the assembling time and the assembling cost are considerable.

Moreover, during operations of the fans 12, the vibration energy generated by the fans 12 will be transmitted to the case structure 10 through the hard fastening elements (i.e. the screws 122) and the positioning plate 13. Then, the vibration energy is transmitted to the data storage device 101, the circuit board 103 and the electronic components 102, which are mounted on the circuit board 103. As known, the vibration energy of the operating fans 12 may deteriorate performance and stability of the data storage device 101 or the electronic components 102. Under this circumstance, the possibility of damaging or loosening the electronic components of the electronic device 1 is increased.

SUMMARY OF THE INVENTION

The present invention provides a case structure to be assembled in a simplified fashion so that the assembling time and the assembling cost are reduced.

The present invention also provides a fan frame fixing module for reducing the vibration energy of the operating fans, thereby minimizing the possibility of damaging or loosening the electronic components.

In accordance with an aspect of the present invention, the case structure includes a first housing and a fan frame fixing module. The fan frame fixing module includes a fan frame, a positioning part and an auxiliary part. The positioning part is disposed on the first housing. The auxiliary part is disposed on the first housing. The fan frame urges against the first housing and the positioning part, and the auxiliary part urges against the fan frame so that the fan frame is fixed on the first housing.

In an embodiment, the case structure further includes a second housing. After the second housing and the first housing are combined together, a receptacle is defined to accommodate the fan frame fixing module.

In an embodiment, the fan frame fixing module further includes plural vibration-absorbing elements, which are arranged between the fan frame and the auxiliary part.

In an embodiment, the fan frame further includes plural partitioning plates configured to define plural receiving parts for accommodating respective fans.

In an embodiment, the fan frame further includes a hollow structures and plural openings.

In an embodiment, the fans are embedded into the hollow structures so that the fans are installed within the receiving parts of the fan frame.

In an embodiment, the positioning part is a raised block disposed on the bottom surface of the first housing with a specific distance apart from a side edge of the first housing.

In an embodiment, the auxiliary part has plural perforations, and the first housing has plural holes corresponding to the perforations.

In an embodiment, the fan frame further includes plural fastening elements. The fastening elements are penetrated through the perforations and the holes of the first housing so that the auxiliary part is fixed on the first housing.

In accordance with another aspect of the present invention, the fan frame fixing module includes a fan frame, a positioning part and an auxiliary part. The positioning part is disposed on the first housing. The auxiliary part is disposed on the first housing. The fan frame urges against the first housing and the positioning part, and the auxiliary part urges against the fan frame so that the fan frame is fixed on the first housing.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
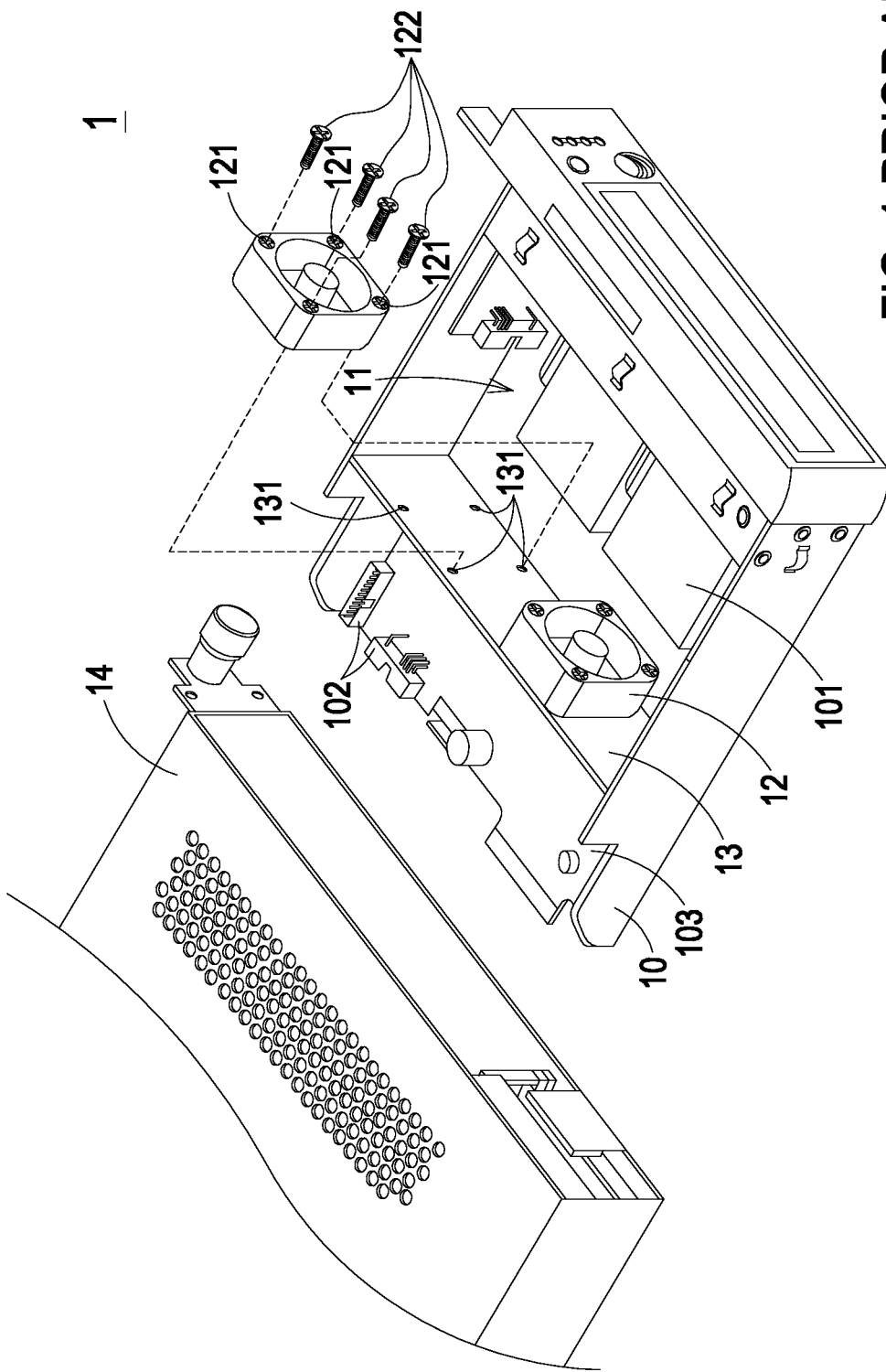
FIG. 1 is a schematic exploded view illustrating a case structure having a fan set according to the prior art.
Figure 2:
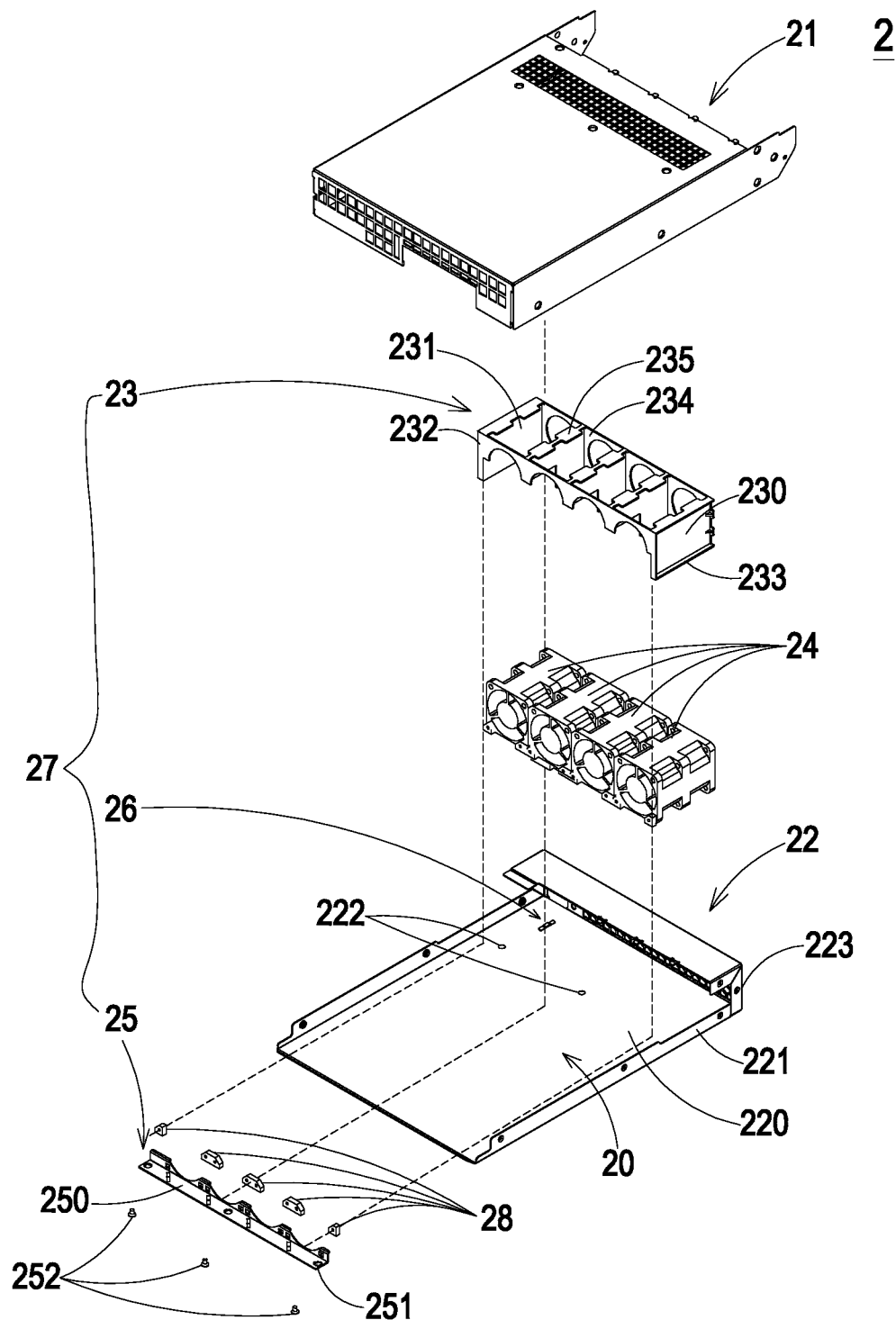
FIG. 2 is a schematic exploded view illustrating a case structure according to a first embodiment of the present invention.

FIG. 2 is a schematic exploded view illustrating a case structure according to a first embodiment of the present invention. As shown in FIG. 2, the case structure 2 includes a second housing 21 and a first housing 22. After the second housing 21 and the first housing 22 are combined together, a receptacle 20 is defined for accommodating a fan frame fixing module 27. In this embodiment, the fan frame fixing module 27 includes a fan frame 23, a positioning part 26 and an auxiliary part 25. The positioning part 26 and the auxiliary part 25 are disposed on a first bottom surface 220 of the first housing 21. The positioning part 26 is disposed on the bottom surface 220 of the first housing 22 with a specific distance apart from one side edge of the first housing 22. The fan frame 23 is used for accommodating plural fans 24. In addition, the fan frame 23 includes a first side plate 230, a second side plate 231 and a first surface 232.

For combining the fan frame 23 with the second housing 21 and the first housing 22, the plural fans 24 are firstly accommodated within the fan frame 23. Then, the first side plate 230 of the fan frame 23 urges against a first rim 221 of the first housing 22, and the second side plate 231 of the fan frame 23 urges against the positioning part 26 of the first housing 22 so that the both sides of the fan frame 23 are fixed. After the auxiliary part 25 urges against the first surface 232 of the fan frame 23, the fan frame 23 is fixed on the first housing 22. Afterwards, the second housing 21 and the first housing 22 are combined together, the case structure 2 with the fan frame fixing module 27 is shown in FIG. 2.

In some embodiments, the fan frame fixing module 27 further includes a vibration-absorbing elements 28. The vibration-absorbing elements 28 are arranged between the auxiliary part 25 and the first surface 232 of the fan frame 23 for absorbing the vibration energy of the operating fans 24 so that the influence of the vibration on the first housing 22 is reduced. In this situation, the performance of the electronic components (not shown) will not be adversely affected by the fans 24. An example of the vibration-absorbing element 28 is made of rubbery, sponge or any other vibration-absorbing material. Alternatively, the vibration-absorbing elements 28 can be arranged between the auxiliary part 25 and the fans 24 within the fan frame 23 for absorbing and attenuating the vibration energy of the operating fans 24. As a consequence, the possibility of damaging or loosening the electronic components of the case structure 2 will be reduced, and the stability thereof will be enhanced.

Figure 3:
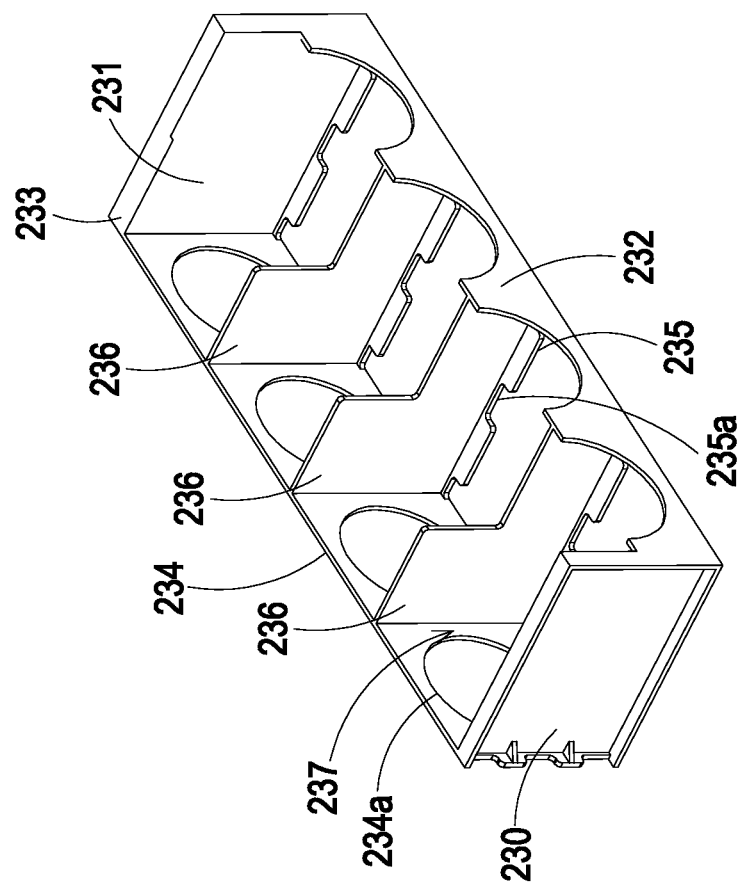
FIG. 3 is a schematic perspective view illustrating the fan frame as shown in FIG. 2.
Figure 4:
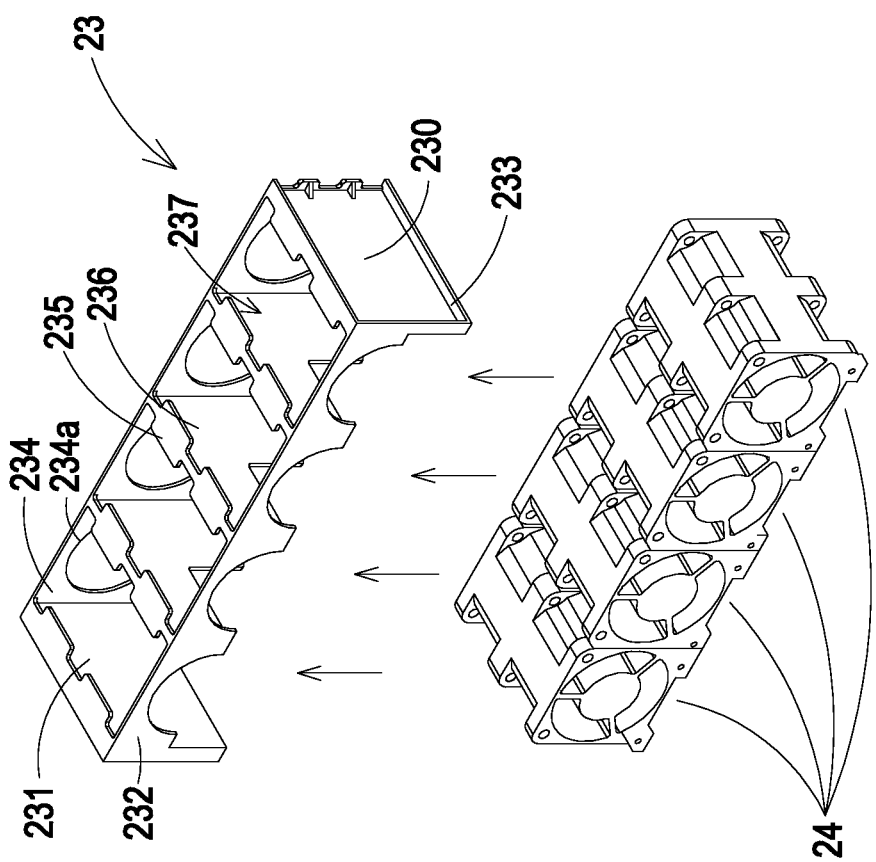
FIG. 4 is a schematic exploded view illustrating a process of assembling the fans with the fan frame as shown in FIG. 2.

FIG. 3 is a schematic perspective view illustrating the fan frame as shown in FIG. 2. As shown in FIG. 3, the fan frame 23 includes the first side plate 230, the second side plate 231, the first surface 232, a second surface 233, a third surface 234, a fourth surface 235 and plural partitioning plates 236. The first side plate 230 and the second side plate 231 are opposed to each other. The first surface 232 and the third surface 234 are opposed to each other. The second surface 233 and the fourth surface 235 are opposed to each other. The partitioning plates 236 are disposed within the fan frame 23 and substantially parallel with the first side plate 230 and the second side plate 231. By the partitioning plates 236, the space within the fan frame 23 is divided into plural receiving parts 237 for receiving respective fans 24. In this embodiment, as shown in FIG. 4, three partitioning plates 236 are disposed within the fan frame 23. By the partitioning plates 236, the pace within the fan frame 23 is divided into four receiving parts 237 for respectively receiving four fans 24.

FIG. 4 is a schematic exploded view illustrating a process of assembling the fans with the fan frame as shown in FIG. 2. Please refer to FIGS. 3 and 4. The majorities of the first surface 232 and the second surface 233 are hollow structures. In addition, plural openings 234a and 235a are respectively formed in the third surface 234 and the fourth surface 235. As shown in FIG. 4, after the fans 24 are embedded into the hollow structures of the first surface 232 and the second surface 233, the fans 24 are installed within the receiving parts 237 of the fan frame 23. After the fans 24 are installed within the fan frame 23, the airflow driven by the fans 24 may be exhausted out of the fan frame 23 through the hollow structure of the first surface 232 and the openings 234a of the third surface 234 in order to remove the heat energy from the circuit board or the electronic components within the case structure 2. In such ways, after the fans 24 are installed within the receiving parts 237 of the fan frame 23, it is not necessary to successively use fastening elements (e.g. screws) to fix the fans 24 within the fan frame 23. Since the process of installing the fans 24 within the fan frame 23 is simplified, the assembling time and assembling cost of the case structure are largely reduced.

Figure 5:
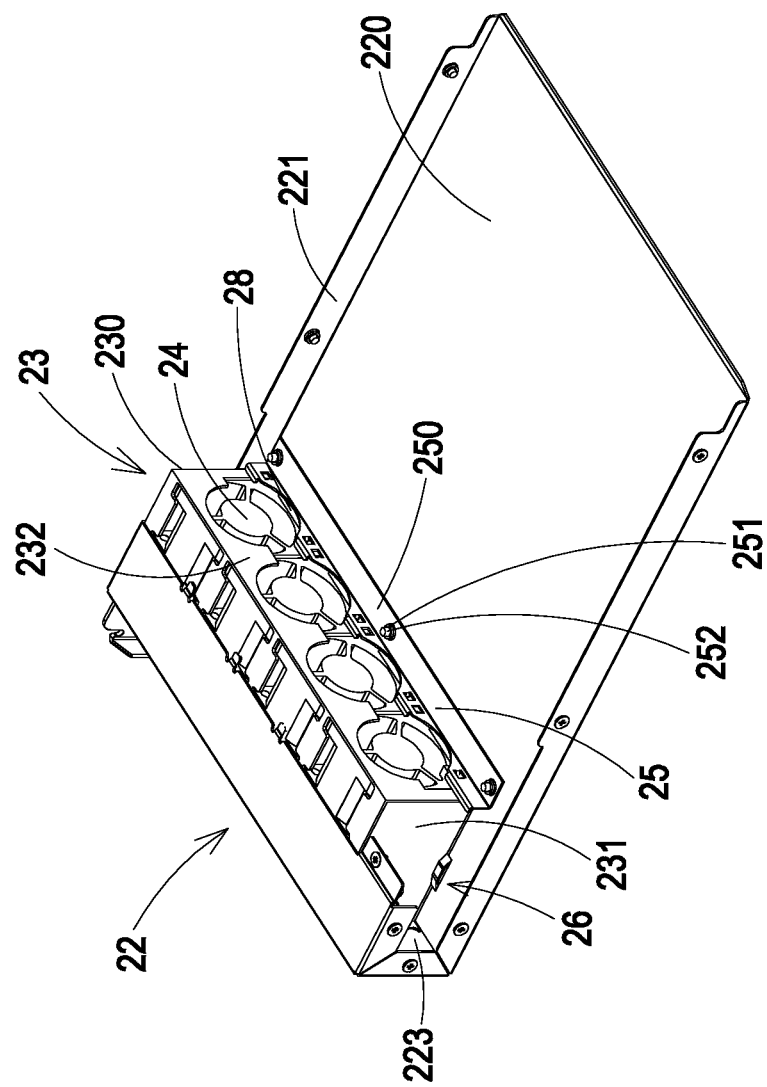
FIG. 5 is a schematic perspective views illustrating the combination of the fan frame fixing module and first housing of the case structure according to an embodiment of the present invention.

FIG. 5 is a schematic perspective views illustrating the combination of the fan frame fixing module and first housing of the case structure according to an embodiment of the present invention. After the fans 24 are installed within the receiving parts 237 of the fan frame 23, the second surface 233 of the fan frame 23 (see FIG. 4) is placed on the first bottom surface 220 of the first housing 22. Then, while the first side plate 230 and the second side plate 231 are respectively sustained against the first rim 221 of the first housing 22 and the positioning part 26, the both sides of the fan frame 23 are confined. In this embodiment, the positioning part 26 is a raised block. The configuration of the positioning part 26 may be varied according to the practical requirements.

In this embodiment, the third surface 234 of the fan frame 23 (see FIG. 4) faces a third side plate 223 of the first housing 22 for facilitating confining the position of the fan frame 23 with respect to the first housing 22. Then, the auxiliary part 25 urges against the first surface 232 of the fan frame 23, and the auxiliary part 25 is fixed on the first bottom surface 220 of the first housing 22. Consequently, the fan frame 23 is combined with the first housing 22. In this embodiment, the first bottom surface 220 of the first housing 22 includes plural holes 222 (see FIG. 2). The auxiliary part 25 further includes a second bottom surface 250. The second bottom surface 250 of the auxiliary part 25 includes plural perforations 251. The perforations 251 of the second bottom surface 250 correspond to the holes 222 of the first bottom surface 220 of the first housing 22. For fixing the auxiliary part 25 on the first bottom surface 220 of the first housing 22, the auxiliary part 25 urges against the first surface 232 of the fan frame 23 firstly, and the second bottom surface 250 of the auxiliary part 25 is placed on the first bottom surface 220 of the first housing 22 such that the perforations 251 are aligned with the holes 222. Then, by penetrating corresponding fastening elements 252 through the perforations 251 and the holes 222, the auxiliary part 25 will be fixed on the first bottom surface 220 of the first housing 22. Meanwhile, the fan frame 23 is fixed on the first housing 22. An example of the fastening element 252 includes but is not limited to a screw, an engaging element or a coupling element.

From the above description, the present invention provides a case structure and a fan frame fixing module. Since the fans are installed within the receiving parts of the fan frame, the process of installing the fans is simplified. Moreover, after the fan frame urges against the first rim, the positioning part and the auxiliary part directly, the fan frame is fixed on the first housing. Since it is not necessary to successively use fastening elements to fix the fans within the fan frame, the assembling time and assembling cost of the case structure are largely reduced. Moreover, since no hard fastening elements (e.g. screws) are directly contacted with the fans by the fan frame fixing module of the present invention, the vibration energy of the operating fans to be transmitted to the electronic components within the case structure will be reduced. As a consequence, the operations of the electronic components within the case structure are stable, and the adverse affect of the vibration will be minimized.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A case structure, comprising:
    a plurality of fans, said plural fans are disposed in parallel connection;
    a first housing having a bottom surface, a first rim that extends upwardly from said bottom surface, and a second rim that also extends upwardly from said bottom surface and is positioned opposite said first rim; and
    a fan frame fixing module comprising:
        a fan frame comprising a first side plate, a second side plate, a first surface that extends between said first and second side plates, and plural partitioning plates, said first side plate and said second plate being disposed opposite to each other, said plural partitioning plates being disposed between said first side plate and said second side plate so as to define plural receiving parts for accommodating said plural fans respectively, wherein only one of said partitioning plates is located between adjacent two of said plural fans;
        a positioning part, said positioning part is a raised block disposed on said bottom surface of said first housing with a specific distance apart from said first rim of said first housing, wherein said first side plate and said second side plate of said fan frame press and contact against said first rim of said first housing and said positioning part, respectively;
        an auxiliary part disposed on said bottom surface of said first housing, said auxiliary part extending along said bottom surface in a direction perpendicular to said first and second rims, wherein said auxiliary part presses and contacts against said first surface of said fan frame such that said fan frame is secured against each of said first rim, said positioning part, and said auxiliary part; and
        plural vibration-absorbing elements, which are arranged between said fan frame and said auxiliary part.

2. The case structure according to claim 1, wherein said case structure further comprises a second housing, and after said second housing and said first housing are combined together, a receptacle is defined to accommodate said fan frame fixing module.

3. The case structure according to claim 1, wherein said fan frame further comprises hollow structures and plural openings.

4. The case structure according to claim 3, wherein said fans are embedded into said hollow structures so that said fans are installed within said receiving parts of said fan frame.

5. The case structure according to claim 1, wherein said auxiliary part has plural perforations, and said first housing has plural holes corresponding to said perforations.

6. The case structure according to claim 5, wherein said fan frame further comprises plural fastening elements, and said fastening elements are penetrated through said perforations and said holes of said first housing so that said auxiliary part is fixed on said first housing.

7. A fan frame fixing module of a case structure, said case structure comprising a first housing and a plurality of fans, said first housing having a bottom surface, a first rim that extends upwardly from said bottom surface, and a second rim that also extends upwardly from said bottom surface and is positioned opposite said first rim said plural fans are disposed in parallel connection, said fan frame fixing module comprising:
    a fan frame comprising a first side plate, a second side plate, a first surface that extends between said first and second side plates, and plural partitioning plates, said first side plate and said second plate being disposed opposite to each other, said plural partitioning plates being disposed between said first side plate and said second side plate so as to define plural receiving parts for accommodating said plural fans respectively, wherein only one of said partitioning plates is located between adjacent two of said plural fans;
    a positioning part, said positioning part is a raised block disposed on said bottom surface of said first housing with a specific distance apart from said first rim of said first housing, wherein said first side plate and said second side plate of said fan frame press and contact against said first rim of said first housing and said positioning part, respectively;
    an auxiliary part disposed on said bottom surface of said first housing, said auxiliary part extending along said bottom surface in a direction perpendicular to said first and second rims, wherein said auxiliary part presses and contacts against said first surface of said fan frame such that said fan frame is secured against each of said first rim, said positioning part, and said auxiliary part; and
    plural vibration-absorbing elements, which are arranged between said fan frame and said auxiliary part.

8. The fan frame fixing module according to claim 7, wherein said fan frame further comprises hollow structures and plural openings.

9. The fan frame fixing module according to claim 8, wherein said fans are embedded into said hollow structures so that said fans are installed within said receiving parts of said fan frame.

10. The fan frame fixing module according to claim 7, wherein said auxiliary part has plural perforations, and said first housing has plural holes corresponding to said perforations.

11. The fan frame fixing module according to claim 10, wherein said fan frame further comprises plural fastening elements, and said fastening elements are penetrated through said perforations and said holes of said first housing so that said auxiliary part is fixed on said first housing.

12. A case structure, comprising:
a plurality of fans;
a first housing having a bottom surface, a first rim that extends upwardly from said bottom surface, and a second rim that also extends upwardly from said bottom surface and is positioned opposite said first rim; and
a fan frame fixing module comprising:
a fan frame comprising a first side plate, a second side plate, a first surface that extends between said first and second side plates, and plural partitioning plates, said first side plate and said second plate being disposed opposite to each other, said plural partitioning plates being disposed between said first side plate and said second side plate so as to define plural receiving parts for accommodating said plural fans respectively, wherein only one of said partitioning plates is located between adjacent two of said plural fans, and said plural fans are arranged in parallel within said fan frame;
a positioning part, said positioning part is a raised block disposed on said bottom surface of said first housing with a specific distance apart from said first rim of said first housing, wherein said first side plate and said second side plate of said fan frame press and contact against said first rim of said first housing and said positioning part, respectively;
an auxiliary part disposed on said bottom surface of said first housing, said auxiliary part extending along said bottom surface in a direction perpendicular to said first and second rims, wherein said auxiliary part presses and contacts against said first surface of said fan frame such that said fan frame is secured against each of said first rim, said positioning part, and said auxiliary part; and
plural vibration-absorbing elements, which are arranged between said fan frame and said auxiliary part.

* * * * *